(12) United States Patent
Fukuoka et al.

(10) Patent No.: US 7,019,455 B2
(45) Date of Patent: Mar. 28, 2006

(54) ORGANIC ELECTRO-LUMINESCENCE DEVICE ENCAPSULATING STRUCTURE

(75) Inventors: Nobuhiko Fukuoka, Ebina (JP); Nobuyuki Ushifusa, Yokohama (JP); Takashi Inoue, Yokohama (JP); Keiko Nakano, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 150 days.

(21) Appl. No.: 10/359,157

(22) Filed: Feb. 6, 2003

(65) Prior Publication Data

US 2003/0164681 A1  Sep. 4, 2003

(30) Foreign Application Priority Data

Mar. 1, 2002  (JP) .............................. 2002-055167

(51) Int. Cl.
*H01J 1/62* (2006.01)
*H01J 63/04* (2006.01)

(52) U.S. Cl. ..................... 313/504; 313/506; 313/512

(58) Field of Classification Search ............... 313/504, 313/506, 509, 512, 498
See application file for complete search history.

(56) References Cited

U.S. PATENT DOCUMENTS

| | | | | |
|---|---|---|---|---|
| 5,990,615 A | * | 11/1999 | Sakaguchi et al. | .......... 313/504 |
| 6,356,032 B1 | * | 3/2002 | Suzuki et al. | ............ 315/169.3 |
| 6,787,249 B1 | * | 9/2004 | Seo | .............................. 428/690 |
| 2001/0046579 A1 | * | 11/2001 | Ishii et al. | ..................... 428/68 |
| 2002/0068192 A1 | * | 6/2002 | Moriyama et al. | .......... 428/690 |
| 2004/0051449 A1 | * | 3/2004 | Klausmann et al. | ........ 313/512 |

FOREIGN PATENT DOCUMENTS

| | | |
|---|---|---|
| JP | 11-176571 | 7/1999 |
| JP | 2001-185362 | 7/2001 |

* cited by examiner

*Primary Examiner*—Joseph Williams
*Assistant Examiner*—Kevin Quarterman
(74) *Attorney, Agent, or Firm*—Antonelli, Terry, Stout and Kraus, LLP.

(57) ABSTRACT

A cap surrounding projection is formed on an outer periphery of a light transmitting cap substrate simultaneously with the formation of pixel separation banks. A surrounding recess is formed at a position, opposed to the cap surrounding projection, on a substrate provided with emitter elements, the projection and the recess being joined through a sealant with an absorbent arranged therein. With such a construction, it becomes possible to efficiently take out light from an emitting layer and to highly accurately seal the substrate provided with the emitter elements and the light transmitting cap substrate, thus realizing an organic electroluminescence device of high reliability.

10 Claims, 6 Drawing Sheets

ORGANIC ELECTRO-LUMINESCENCE DEVICE ENCAPSULATING STRUCTURE

BACKGROUND OF THE INVENTION

The present invention relates to an organic electro-luminescence device and to a method of manufacturing the same; and, more particularly, the invention relates to a method of manufacturing a cap having a light transmissivity for an organic electro-luminescence device and to a method of overlapping the cap on a substrate by self-alignment.

Generally, an organic electro-luminescence device is finished by sequentially implementing the steps of patterning anode electrodes formed on a glass substrate for every element; forming banks for separating a laminate formed on the anode electrodes for every element; forming hole-introduction layers, which introduce electron holes from the anode electrodes, in spaces partitioned by the banks; forming hole-transport layers; which transport electron holes to emitting layers; selecting elements and forming emitting layers composed of an organic film for emission in red, green and blue; forming electron-transport layers which transport electrons from the cathode electrodes; forming cathode electrodes which supply electrons; and joining a cap to the glass substrate with a sealing adhesive in order to block and isolate these laminates from the outside.

However, an organic electro-luminescence device, such as described in JP-A-11-176571, for example, cannot maintain an emission of predetermined quality with the lapse of drive time because, in spite of airtight sealing by a cap, under the influence of outside air and moisture, peeling is caused between the emitting layers and the electrode layers, and the constituent materials change in quality, so that non-emitting regions called dark spots are generated.

SUMMARY OF THE INVENTION

As described above, the atmosphere at the time of sealing and the manner of maintaining the state of the device immediately after sealing in the future become a problem because of the susceptibility of the device to outside air and moisture. Also, since the emitting layers are formed from an organic material, there is the possibility that gas is generated after sealing. Therefore, it is essential to perform sealing under conditions where an absorbent is employed that is capable of absorbing generated gas and outside air and moisture entering through the sealant.

Generally, a cap is shaped such that an inner portion is recessed from an outer periphery thereof to make it possible to mount therein an absorbent so that the absorbent does not interfere with the emitter elements that are composed of emitting layers, electrodes and so on. Ways to form a recess in an interior surface of a cap include carving a recess in an interior surface of a glass plate or quartz plate by machining or sand blasting, and integral molding of a metallic plate or glass plate by use of a press or the like. In the case of using these caps, there is no problem when emission is taken out from the side of the substrate on which the emitting layers are formed. On the other hand, in the case where emission is taken out from the side where the cap is provided, which makes it possible to take out emission at a high numerical aperture without the emission being affected by interception caused by wiring on the substrate and drive elements, the surface condition of the cap may possibly causes a problem.

That is, with a cap obtained by carving a recess in an interior surface of a glass plate or quartz plate, the light transmissivity is made low because of machining marks present in the carved interior surface. Also, with a cap in which a recess is obtained through integral molding by use of a press, the taking-out of emission is impossible with a metal plate, and the surface accuracy of the die becomes important with a glass plate, because the surface of the die is transferred to the surface of the glass plate. Maintenance of high surface accuracy is difficult, and the possibility of degradation in the light transmissivity is high because the glass surfaces are frosted with deterioration of the die in the case of mass production. Therefore, a first objective is to manufacture a cap having a high light transmissivity in the case where emission is taken out from the side of the device where the cap is located.

Also, the step of overlapping a cap on a glass substrate, on which emitting layers of an organic electro-luminescence device are formed, and sealing them is implemented in a space that is closed from the outside in order to perform the operation in an atmosphere from which active gas and moisture are removed as much as possible. In order to overlap the glass substrate, on which emitting layers of an organic electro-luminescence device are formed, and the cap in a closed space, a positioning function performed by means of a camera or the like is necessary; and, further, equipment for irradiating ultraviolet rays for curing the sealant and for heating are also necessary. Therefore, there is a need for a high-performance manufacturing apparatus that is capable of atmosphere adjustment having a high close quality, of performing positioning while using a camera or the like, of irradiating with ultraviolet rays, and the heating, so that the installation cost is necessarily high.

Thus, a second objective is to provide a high-performance and in expensive manufacturing apparatus.

Hereupon, the invention has as its object to provide an organic electro-luminescence device having a cap of high light transmissivity that is capable of allowing emission to be taken out from the side of the device where the cap is located, and a manufacturing method thereof, and to provide an organic electro-luminescence device, in which a substrate formed with an organic emitter element and a cap are accurately overlapped together by use of an apparatus having no positioning function, and a manufacturing method thereof.

In order to solve the above-described problems, the invention provides an organic electro-luminescence device, having emitter elements, in which an organic layer having at least an emitting layer is formed in pixel separation banks on anode electrodes and interposed between the anode electrodes and cathode electrodes, which emitter elements are arranged on a emitter element forming substrate composed of a glass substrate or the like, and wherein a material transmitting therethrough ultraviolet rays forms a cap outer-periphery surrounding rib on an outer periphery of a cap substrate that is composed of a light transmitting substrate having an equivalent physical property to that of the emitter element forming substrate in a picture-frame manner, the emitter elements being arranged inside the cap outer-periphery surrounding rib and being covered by the cap outer-periphery surrounding rib and the cap substrate.

Also, an absorbent for absorption of generated gas or moisture is arranged between an outside of a region, in which the emitter elements are formed, on the emitter element forming substrate opposed to and overlapped on the cap substrate, and the cap outer-periphery surrounding rib provided on the cap substrate in a picture-frame manner.

Further, the cathode electrodes are formed from a light transmitting conductive material, and emission generated in the emitting layer is transmitted through the cathode electrodes so that light transmitted through the cathode electrodes is seen through the cap substrate composed of a light transmitting substrate.

Also, positioning ribs composed of the same material as that of the pixel separation banks, which serve to separate the emitting layer, are provided to surround the emitter elements, and they are larger in width than the pixel separation banks, and the pixel separation banks and the positioning ribs, which are different from each other in film thickness (height) due to a difference in width, are formed in the same processing.

Further, the circumferential and inner circumferential sizes of the positioning ribs are smaller or larger than the circumferential and inner circumferential sizes of the cap outer-periphery surrounding rib, so that when the emitter element forming substrate formed with the emitter element and the cap composed of the cap substrate and the cap outer-periphery surrounding rib are overlapped together, the sides of the positioning ribs and the sides of the cap outer-periphery surrounding rib come into contact with each other, and so the positioning ribs serve as a guide when the cap and the emitter element forming substrate are overlapped together.

In this manner, according to the invention, the cap substrate, that is composed of a light transmitting substrate having a substantially equivalent physical property to that of the emitter element forming substrate, on which emitter elements are formed, is used, and a surrounding projection is provided on an outer periphery of the cap substrate in a picture-frame manner, whereby it is possible to obtain a cap of high light transmissivity having an area shaped, so that an inner portion is recessed from an outer periphery thereof to receive an absorbent. Further, the absorbent is mounted between the outside of an area, in which opposed emitter elements are formed, and the cap outer-periphery surrounding rib shaped in a picture-frame manner, so that emission is intercepted only by the cap substrate composed of a light transmitting substrate, and so that the emission can be effectively taken out through the cap side.

Also, since the positioning ribs are formed on the emitter element forming substrate, on which the emitter elements are formed, together with the pixel separation banks, the positioning ribs can be formed without positional deviation relative to the area in which the emitter elements are formed. Circumferential and inner circumferential sizes of the positioning ribs are alternated with circumferential and inner circumferential sizes of the cap outer-periphery surrounding rib, whereby the positioning ribs can serve as a guide at the time of overlapping, and so accurate overlapping of the cap can be effected with an area, in which emitter elements are formed, being used as a reference, although a positioning function, such as with the use of a camera or the like, is not provided.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF PREFERRED EMBODIMENTS

An explanation will be given of a first embodiment of an organic electro-luminescence device of the present invention.

While an organic electro-luminescence device includes a low molecular system and a polymer system as an organic material used in portions contributing to emission, the invention puts no limitation on materials, and so an organic electro-luminescence device in which both are mixed together will do.

An organic electro-luminescence device with a low molecular system is generally composed of a glass substrate/anode electrode/hole-injection layer/hole-transport layer/emitting layer/electron-transport layer/cathode electrode/cap. Meanwhile, an organic electro-luminescence device with a polymer system is generally composed of a glass substrate/anode electrode/hole-transport layer/emitting layer/cathode electrode/cap.

In an organic electro-luminescence device with a polymer system, a hole-transport layer in some cases has both of the characteristics of hole-injection layer/hole-transport layer in an organic electro-luminescence device with a low molecular system, and in an organic electro-luminescence device with a polymer system, only a cathode electrode in some cases does duty for electron-transport layer/cathode electrode in an organic electro-luminescence device with a low molecular system. Also, a cap and a glass substrate are bonded together with a sealant therebetween, and an absorbent is mounted therein for absorption of moisture and gas. The invention is not limited to the materials, composition or the like used in the embodiment, and the embodiment is intended for realizing an organic electro-luminescence device.

Particular embodiments of the invention will be described below in detail with reference to the drawings.

FIRST EMBODIMENT

Figure 1:
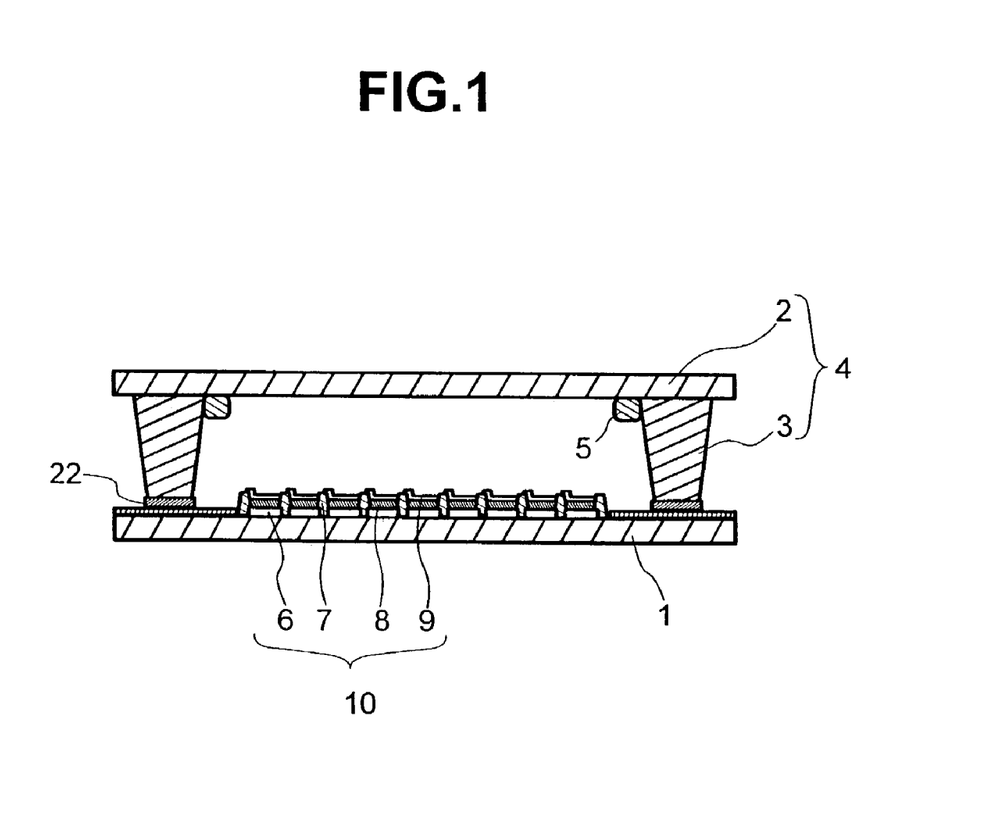
FIG. 1 is a cross sectional view showing the configuration of members constituting a cap and the positional relationship between the cap and the emitter elements.

FIG. 1 is a cross sectional view showing the configuration of members constituting a cap according to a first embodiment of the invention, particularly showing the positional relationship between the cap and the emitter elements. In FIG. 1, there are an emitter element forming substrate 1; a cap substrate 2 and a cap outer-periphery surrounding rib 3 forming a cap 4; an absorbent material 5; anode electrodes 6, pixel separation banks 7, an emission contributing layer 8 and cathode electrodes 9 forming the emitter elements 10; and a sealant 22.

The emitter element forming substrate 1 is formed from a glass substrate or the like, and the cap substrate 2 is made of the same light transmitting substrate material as that of the emitter element forming substrate 1. The cap 4 is composed of the cap substrate 2 and the cap outer-periphery surrounding rib 3, and the cap outer-periphery surrounding rib 3 is formed on an outer periphery of the cap substrate 2. The emitter elements 10 are composed of the anode electrodes 6, the pixel separation banks 7, the emission contributing layer 8, and the cathode electrodes 9; and, the cap outer-periphery surrounding ribs 3 are formed to bound a larger region than that in which the emitter elements 10 are formed so as to have spacing a greater than a total of the thickness of the absorbent material 5 and the extent of the emitter elements 10.

In addition, the emission contributing layer 8, that is interposed between the anode electrodes 6 and the cathode electrodes 9, so as to contribute to the emission, is varied in layer configuration depending upon the material system (polymer system, low molecular system) of a luminescent layer, as described previously.

The cap outer-periphery surrounding rib 3 can be formed from an organic material and an inorganic material. Methods for forming the rib include a method of straight-writing by means of screen printing, the use of a dispenser or the like, and a method of forming the rib by coating a material of the cap outer-periphery surrounding rib 3 on an entire one side of the cap substrate 2 by means of a spinner or the like, and then removing other portions than an unnecessary periphery using exposure and development processing.

The absorbent 5 serves to absorb gas generated from the emitter elements, as well as outside air and moisture entering from outside after sealing. Also, the absorbent material 5 is mounted outside a region in which the emitter elements 10 are formed, in a region interposed between the periphery of the emitter elements 10 and the inside surfaces of the cap outer-periphery surrounding ribs 3. Thereby, emission can be effectively taken out to the outside through the cap substrate 2, which is formed as a light transmitting substrate, without the absorbent material 5 interrupting the emission of the emitter elements 10.

Figure 2A:
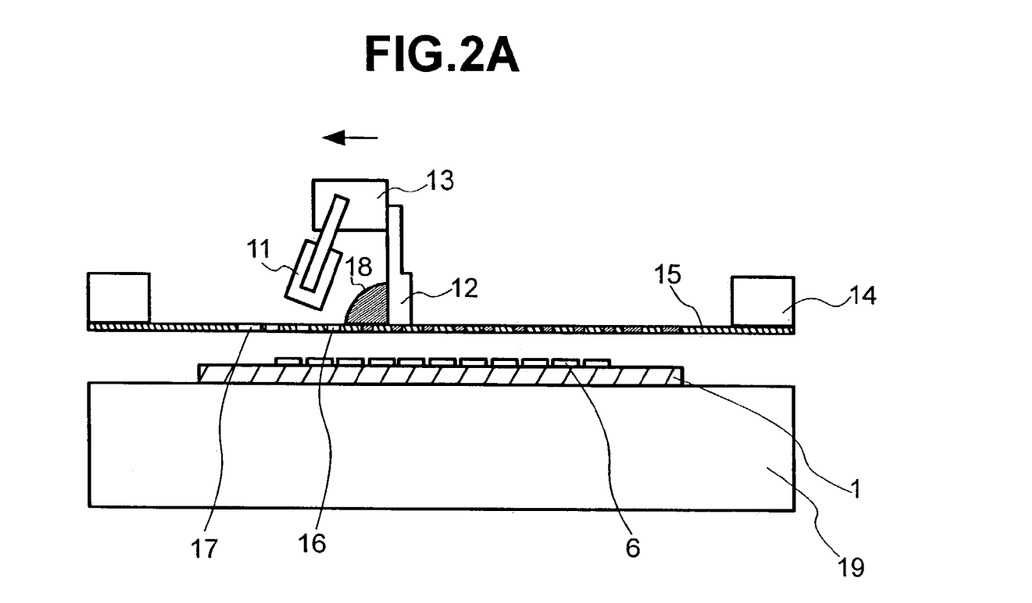
FIGS. 2A and 2B are diagrams illustrating a processing for simultaneously forming pixel separation banks and positioning ribs.
Figure 2B:
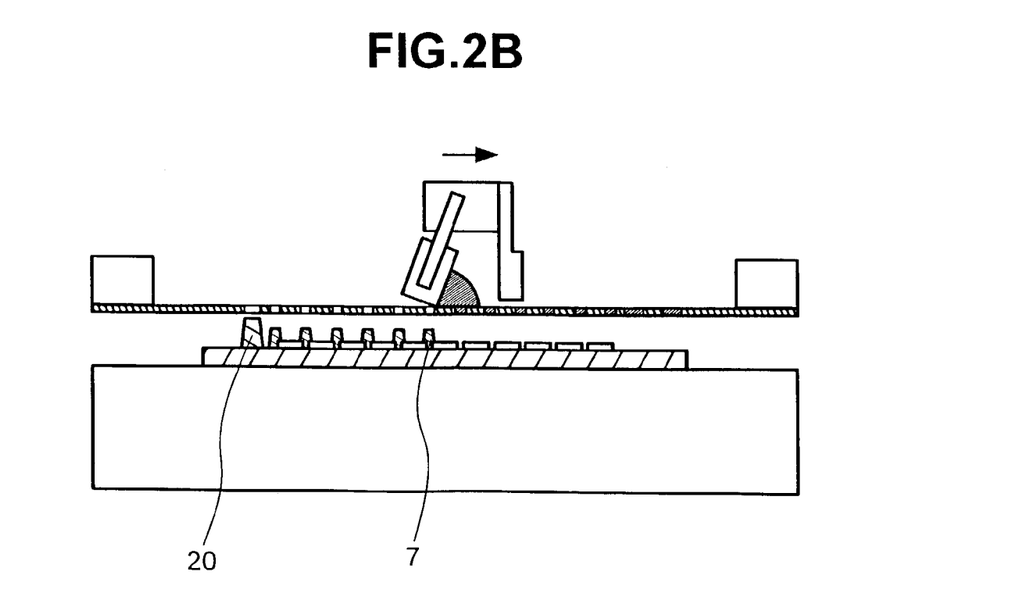

FIGS. 2A and 2B are views illustrating a series of processing steps performed when pixel separation banks according to the first embodiment of the invention and positioning ribs are formed at the same time. In FIGS. 2A and 2B, there are a squeegee 11, a scraper 12, a head 13 having a mechanism for holding and moving the squeegee 11 and the scraper 12 up and down, a screen form plate 14, a screen mask 15, an aperture pattern for transfer of pixel separation banks 16, an aperture pattern for transfer of positioning ribs 17, ink 18, a substrate fixing table 19, and positioning ribs 20.

The squeegee 11 serves to apply ink 18, that is placed on the surface of the screen mask 15 on the side of the squeegee, through the aperture pattern 16 for transfer of pixel separation banks and the aperture pattern 17 for transfer of positioning ribs. The scraper 12 serves to fill the ink 18 into the aperture pattern 16 for transfer of pixel separation banks and the aperture pattern 17 for transfer of positioning ribs provided on the screen mask 15. The squeegee 11 and the scraper 12 are moved up and down by the head 13 such that, at the time of ink filling, the squeegee 11 is lifted and the scraper 12 is lowered so as to be brought into close contact with the screen mask 15; and, at the time of ink application, the scraper 12 is lifted and the squeegee 11 is lowered to be brought into close contact with the screen mask 15. The screen mask 15 is mounted on the screen form plate 14.

Apertures in the aperture pattern 17 for transfer than that of the positioning ribs are necessarily formed to have a larger width of apertures in the aperture pattern 16 for transfer of pixel separation banks. The reason for this is that the inventors of the present invention have found that, in screen printing, the thickness of application is varied according to the width of the apertures in a screen mask. Thus the positioning ribs are made thicker than the film thickness of the pixel separation banks, and the apertures of the aperture pattern 17 for transfer of positioning ribs are greater in width than the apertures of the aperture pattern 16 for transfer of pixel separation banks in order that the positioning ribs will be made thicker than the film thickness of pixel separation banks and be formed in the same printing.

More specifically, there is a tendency that, when apertures in a screen mask have a larger width than a certain width, the coating thickness becomes constant, and as the width of the apertures become smaller in width than the certain width, the coating thickness decreases. By making use of this phenomenon, a different coating thickness can be formed in the same printing process and in the same plane. In addition, this tendency of coating thickness relative to the line width can be varied according to the material of the ink and the specifications of the screen mask.

In the embodiment, polyimide PP-2000 for screen printing, manufactured by Central Glass Corporation, was used as the material for the pixel separation banks, and the screen mask was formed using No. 500 stainless steel mesh having a wire diameter of 18 µm, an aperture size of 33 µm and a numerical aperture of 42% and by forming on the mesh an emulsion (description of product: NSL) manufactured by Tokyo Process Service Corporation and having an excellent solvent resistance, in a film thickness of 30 µm.

With a combination of the ink material and the screen mask, the film thickness was formed to be substantially equal to the emulsion thickness on the screen mask in the range of a line width above 150 µm, and the film thickness being formed decreased as the line width became smaller than 150 µm, such that the film thickness was approximately 5 µm for a line width of 20 µm.

More specifically, in the case where the width of the aperture pattern 17 for transfer of positioning ribs was larger than 150 µm and the width of the pattern 16 for transfer of pixel separation banks was 20 µm, positioning ribs having a film thickness of 30 µm could be formed together with pixel separation banks having a film thickness of 5 µm. A rib having a film thickness of around 30 µm is adequately effective in serving as a positioning guide. In addition, the condition for simultaneous transfer of different coating thicknesses in screen printing is not limited to the above-described materials and a screen form plate having the above-described specifications.

As shown in FIG. 2A, the anode electrodes 6 that are formed on the emitter element forming substrate 1 are aligned so as to register with the aperture pattern 16 for transfer of the pixel separation banks through the screen mask 15 that is mounted on the screen form plate 14, and the emitter element forming substrate 1 is then set and fixed to the substrate fixing table 19. In the embodiment, fine holes provided on the substrate fixing table 19 are used to attract and fix the substrate in response to a reduced pressure applied thereto (suction).

Subsequently, when the ink 18 is to be placed on the screen mask 15, the head 13 lifts the squeegee 11 and lowers the scraper 12 to bring the same into close contact with the screen mask 15; and, thereafter, the scraper 12 is moved to scrape the ink 18 and to fill the ink 18 into the aperture pattern 16 for transfer of pixel separation banks and into the aperture pattern 17 for transfer of positioning ribs. In FIG. 2A, the above scraping and filling are achieved by moving the scraper 12 from right to left.

As shown in FIG. 2B, the head 13 then lifts the scraper 12 and lowers the squeegee 11 to bring it into close contact with the screen mask 15; and, thereafter, the squeegee 11 is moved from left to right to transfer the ink 18, that has been filled in the aperture pattern 16 for transfer of pixel separation banks and the aperture pattern 17 for transfer of the positioning ribs 20, to the emitter element forming substrate 1. Thereby, the pixel separation banks 7 are formed at positions such that the anode electrodes 6 are partitioned from one another; and, at the same time, the positioning ribs 20, which are thicker than the pixel separation banks 7 and have a film thickness capable of adequately taking effect in serving as a guide for positioning, can be formed on the outer periphery of the emitter element forming substrate 1.

FIGS. 3A to 3G are views showing the process of manufacture of an organic electro-luminescence device according to the first embodiment of the invention. In FIGS. 3A to 3G, the reference numeral 21 denotes an external terminal, and the reference numerals 22 denotes a sealant.

Figure 3A:
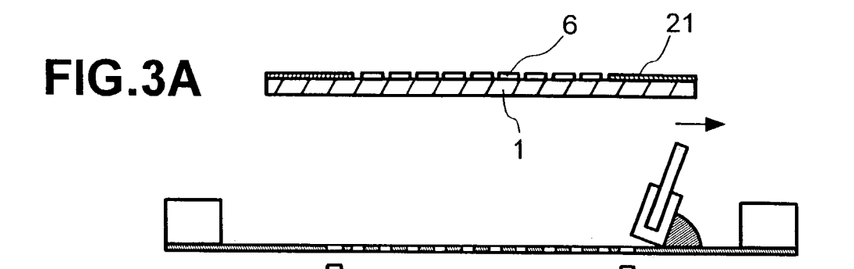
FIGS. 3A to 3G are diagrams illustrating steps in the manufacture of an organic electro-luminescence device according to a first embodiment.

In the embodiment, the anode electrodes 6 and the external terminal 21 are first formed on one side of the luminous layer forming substrate 1, as shown in FIG. 3A. Since emission is taken out from the side where the cap is located, the emitter element forming substrate is not required to be transparent. However, the substrate preferably has the same physical property as the cap. In the embodiment, since a glass substrate having a high light transmittance was used for the cap substrate, a glass substrate (#1737 manufactured by Coring Corporation) of the same quality was used. Also, in the embodiment, since the emitting layers were formed to have a 15.2 inch size of the slenderness ratio of 3:4, the glass substrate was greater by 20 mm on respective sides than the emitting layers so as to have a size of 348 mm×271 mm. Also, the glass substrate had a thickness of 0.7 mm.

Since emission is taken out from the side where the cap is located, the anode electrodes 6 are also not required to be transparent, and so metallic materials or the like having a high electric conductivity can be used for the anode electrodes. Such materials include Cr, Mo—Ta, Ta, Al or the like. Likewise, materials having a high electric conductivity are preferably used for the external terminal 21. In the embodiment, the anode electrodes 6 and the external terminal 21 were formed through exposure and development after sputtering was used to coat the entire surface with a conductive material. In addition, the surfaces of the anode electrodes 6 are preferably smooth. Also, in the embodiment, Al was used to form the anode electrodes 6 and the external terminal 21.

Figure 3B:
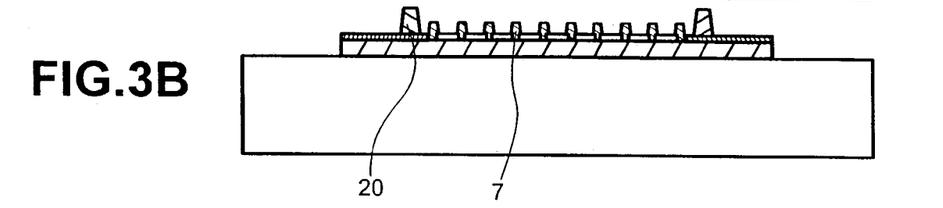

Subsequently, the emitter element forming substrate 1 was held on the substrate fixing table 19 so as to have the anode electrodes 6 and the external terminal 21 facing upward, as shown in FIG. 3B, and the pixel separation banks 7 and the positioning ribs 20, having a greater film thickness than that of the banks, were formed in the same process by means of the method illustrated in FIGS. 2A and 2B. In addition, materials for the pixel separation banks 7 and the positioning ribs 20 are the same and include a polyimide paste, a maleimide varnish, a polyamide, and so on, the materials being preferably of high thixotropy in terms of their shape preserving quality. Also, the materials are not limited to a polyimide but may be ones having less hygroscopicity and susceptible of less gas generation.

In the embodiment, polyimide PP-2000 for screen printing, manufactured by Central Glass Corporation, was used such that after coating, it was raised to 220° C. from room temperature at the rate of 5° C./min in an atmosphere of nitrogen, and after 220° C. was reached, it was maintained for 60 minutes to be cured. Also, the screen form plate was formed of No. 500 stainless steel mesh having a wire diameter of 18 μm, an aperture size of 33 μm and a numerical aperture of 42%, and by forming on the mesh an emulsion composed of screen mask forming photosensitive resin manufactured by Tokyo Process Service Corporation and having an excellent solvent resistance, a pattern was formed.

In the embodiment, one pixel had a display size of 280 μm in length and 80 μm in width, and a pitch of 300 μm in length and 100 μm in width. Since pixel separation banks must cover other areas than display areas, they have a size of 20 μm in both length and width, a pitch of widthwise lines being 300 μm, and a pitch of lengthwise lines being 100 μm. An area, in which pixel separation banks were formed, had a size of 308 mm×231 mm with a diagonal line of 15.2 inches, and the number of pixels provided therein were 1024×3 (three colors of red, green, blue), that is, a total of 3072 in width and 768 in length. Also, the thickness of the pixel separation banks is determined by the thickness of the respective layers, which constitute emitter elements, and the methods of forming the respective layers.

The materials for the emitting layers used in the embodiment comprise a polymer system. Also, the emission contributing layer 8 is composed of hole-transport layer/emitting layers, and the emitter elements are composed of anode electrodes/hole-transport layers/emitting layers/cathode electrodes. The anode electrodes 6 and the cathode electrodes 9 were formed by sputtering and deposition, and the hole-transport layers and the emitting layers were coated by use of an ink jet. The anode electrodes and the cathode electrodes formed by sputtering and deposition were not so much varied in film thickness from immediately after formation and had a film thickness of around 100 nm.

Meanwhile, a diluted ink is used since the hole-transport layers and the emitting layers are coated by use of an ink jet. Therefore, great variation in film thickness is caused immediately after application and after drying, in which the solvent is volatilized. In the embodiment, materials being diluted to contain a solid having a concentration of 3% were used for the hole-transport layers and the emitting layers having red, green and blue colors, and the layers, respectively, were set to 0.1 μm in film thickness after drying, so that the film thickness was 3.3 μm in a non-dried state immediately after application. In the case where the layers are formed with the use of ink diluted by ink jet or the like, the thickness of pixel separation banks is determined by the film thickness immediately after application of the diluted ink.

In the embodiment, since the hole-transport layers and the emitting layers having red, green and blue colors had a thickness of 3.3 μm immediately after application, pixel separation banks was made to have a greater film thickness of 5 μm than the above thickness. When performing an application with the line width being 20 μm and the film thickness being 5 μm, the emulsion for formation of a pattern in the screen form plate is 30 μm.

In addition, there is a tendency in screen printing, when the line width is greater than a certain line width, for the coating thickness to become constant; and, when the line width decreases from the certain line width, the coating thickness decreases as described previously. With a combination of the materials for pixel separation banks and the screen form plate, the tendency of the coating thickness relative to the width of the apertures in the screen form plate to vary depends upon whether the width of the apertures in a screen form plate is above or below 150 μm. Preferably, the positioning ribs 20 have a great thickness in terms of the guiding quality. In the case of the above-described screen form plate, since a line width having no influence on the film thickness is 150 μm or more, the positioning ribs 20 were made 200 μm larger than the above film thickness and defined an area which had a size of 320 mm×243 mm so as to surround the region in which the emitter elements were formed.

Figure 3C:
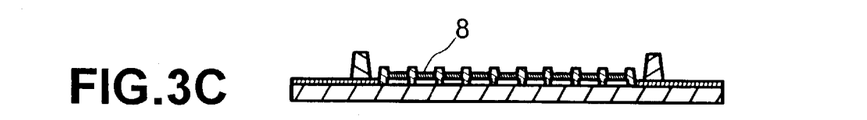

Subsequently, the emission contributing layer 8 was formed in the pixel separation banks, as shown in FIG. 3C. In addition, in the embodiment, the emitting layers of a polymer system were used as described above, and the emission contributing layer 8 between the anode electrodes and the cathode electrodes was composed of hole-transport layers/emitting layers, each of which were applied in the banks. Methods of application include a screen printing method, an ink jet method, and so on, the ink jet method being used in the embodiment. In addition, the hole-transport layers/emitting layers were common to all the colors, and a water colloidal solution (BYTORON P-CH-8000, manufactured by Bayer) containing a high polymer (3, 4-ethylene dioxythiophene), being an electrically conductive high polymer, and a polystyrene sulfonic acid, being a dopant, was used as an ink for hole-transport materials.

Also, used as inks for luminescent materials for emission of respective colors were Green-K manufactured by Dow Corporation, compounded of 1, 2, 3, 4-tetramethylbenzene for a green color, Red-F manufactured by Dow Corporation, compounded of 1, 2, 3, 4-tetramethylbenzene for a red color, and Blue-C manufactured by Dow Corporation, compounded of 1, 3, 5-trimethylbenzene for a blue color. In addition, while the hole-transport layers/emitting layers were common to all the colors, the material and film thickness may be changed for every color, although productivity is decreased.

Figure 3D:
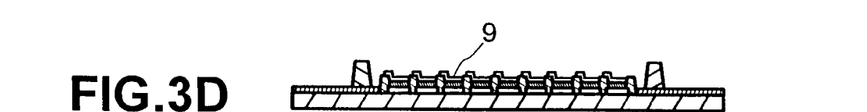

Subsequently, the cathode electrodes 9 composed of a light transmitting conductive material were formed separately for every pixel on a substrate, in which emitting layers of red, green and blue colors were formed on predetermined banks by sputtering, as shown in FIG. 3D. In the embodiment, ITO having a sheet resistivity of about 10 Ω/cm$^2$ was used as the material for the cathode electrodes. Since emission is taken out upwardly of the cathode electrodes, any metallic material permitting no light transmission cannot be used as a material for the cathode electrodes, and so a material having a high light permeability and a high electric conductivity is preferable.

Figure 3E:
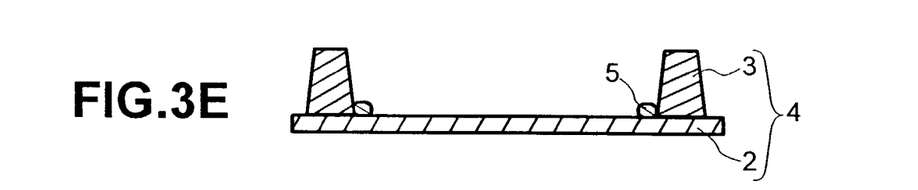

Subsequently, the cap outer-periphery surrounding rib 3 was formed on an outer periphery of the cap substrate 2, which is composed of a light transmitting substrate, in a picture-frame manner, as shown in FIG. 3E, and the absorbent 5 material was mounted in a region surrounded by the cap outer-periphery surrounding rib 3 and in a range not interfering with a region in which the emitter elements were formed, when the cap 4 composed of the cap substrate 2 and the cap outer-periphery surrounding rib 3 was overlapped on the emitter element forming substrate 1. As illustrated with reference to FIG. 1, the cap substrate 2 preferably has a high light permeability. In the embodiment, the cap substrate 2 was a glass substrate (#1737 manufactured by Coring Corporation) being of the same quality as that of the emitter element forming substrate 1 and having a plate thickness of 0.7 mm and a size of 328 mm×251 mm.

Also, as illustrated with reference to FIG. 1, the absorbent 5 material serves to absorb gas generated from the emission contributing layer 8 of an organic material, as well as outside air and moisture entering through the sealant after the cap 4 and the emitter element forming substrate 1 were overlapped and sealed with the use of the sealant in the succeeding processing. Also, the cap outer-periphery surrounding rib 3 was sized to have its sides alternately contacting the positioning ribs 20 and to have a greater thickness than the sum of the thicknesses of the positioning ribs 20 and the absorbent material 5. Since the absorbent 5 used in the embodiment had a thickness of 500 μm and the positioning ribs 20 also used in the embodiment had a thickness of 300 μm, the cap outer-periphery surrounding rib 3 was formed to have a thickness greater than the 800 μm sum of the thicknesses.

Methods of forming the cap outer-periphery surrounding rib 3 include a method of straight-writing by means of screen printing, the use of a dispenser or the like, and a method of forming the rib on the entire surface of the substrate by means of a spinner or the like, and then removing other portions than an unnecessary periphery in exposure and development processing. In the embodiment, screen printing was used to form the cap outer-periphery surrounding rib defining an area having a size of 322 mm×245 mm and a line width of 1800 μm so as to have an inner peripheral side of the cap outer-periphery surrounding rib 3 contacting the positioning ribs 20 which define an area having a size of 320 mm×243 mm.

Also, the material for the cap outer-periphery surrounding rib 3 preferably has a good adherence to the surface of the cap substrate, less hygroscopicity and is susceptible to less gas generation. The material itself preferably has a high seal effect, and an interface between the rib and the cap substrate and the rib itself are preferably as little pervious as possible to outside air and moisture. Also, a material having less absorption of ultraviolet light is used for the cap outer-periphery surrounding rib so that ultraviolet light is irradiated from a cap side to enable curing of the sealant in the case where an ultraviolet-light curing material is used for the sealant.

This makes it possible to irradiate the ultraviolet light on the sealant more uniformly than irradiation from a side of the emitter element forming substrate, in which an area shielded by an external terminal is produced, so that the sealant can cure more stably in the substrate surfaces. In the embodiment, polyimide PP-2000 for screen printing, manufactured by Central Glass Corporation, and being the same as that used as the material for the pixel separation banks, was used for projections on an outer periphery of the cap.

Figure 3F:
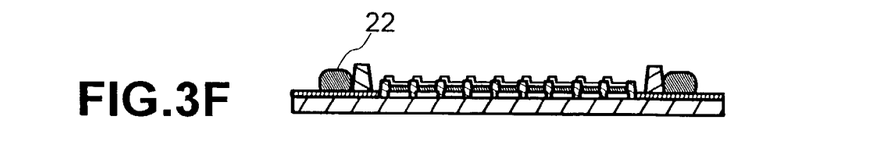

Subsequently, the sealant 22 was applied at a position outside the positioning ribs 20 and opposed to the cap outer-periphery surrounding rib 3, as shown in FIG. 3F. This application method includes the use of a dispenser and screen printing. In the embodiment, a dispenser was used to apply the sealant 22.

Materials for the sealant include UV (ultraviolet) curable materials, hot curable materials, and ultraviolet hot curable materials. In the case of using UV curable materials and ultraviolet hot curable materials, it is possible that ultraviolet light may be scattered and irradiated on the organic electroluminescence device in an area close to the sealant at the time of ultraviolet irradiation to produce a degradation (reduction in service life) in the luminance. Also, in the case of using hot curable materials and ultraviolet hot curable materials, it is possible that when curing is effected at temperatures above 100° C., the organic electro-luminescence device is affected so as to produce a degradation (reduction in service life) in the luminance, as in the case of ultraviolet irradiation. In the embodiment, the sealant was an ultraviolet hot curable material adapted to be subjected to primary curing by ultraviolet irradiation and then secondary curing (main curing) by heating at 80° C.

Figure 3G:
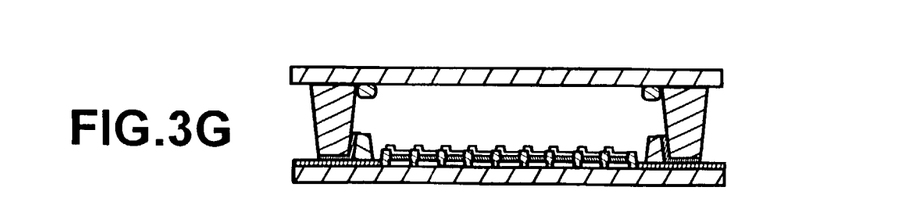

Subsequently, as shown in FIG. 3G, the self-alignment effect given by the positioning ribs 20 and the cap outer-periphery surrounding rib 3 caused the emitter element forming substrate 1 and the cap 4 to be formed in registry with each other only by overlapping, and after effecting shielding sufficient to eliminate leakage of ultraviolet light to an emitter element forming region, ultraviolet light was irradiated from outside the cap substrate 2 to cure the sealant 22. At this time, even without lateral restraint, the cap 4 and the emitter element forming substrate 1, as overlapped, were prevented by the cap outer-periphery surrounding rib 3 and the positioning ribs 20 from deviating from each other.

Subsequently, heating was effected at 80° C. in an oven to subject the sealant 22 to secondary curing (main curing). In addition, the operation was wholly carried out in nitrogen, which is an inert gas. Since the positioning ribs and the cap outer-periphery surrounding rib alternately contact with each other in locations where bonding is effected by the sealant, the bonding distance (width) of the sealant is made longer than that in the case of planar surface bonding with the sealant being the same in width, so that it is possible to prevent outside air and moisture from entering.

Subsequently, a display could be fabricated by connecting a drive circuit to the external terminal 21. The display makes it possible to observe a picture image through the cap.

SECOND EMBODIMENT

Figure 4:
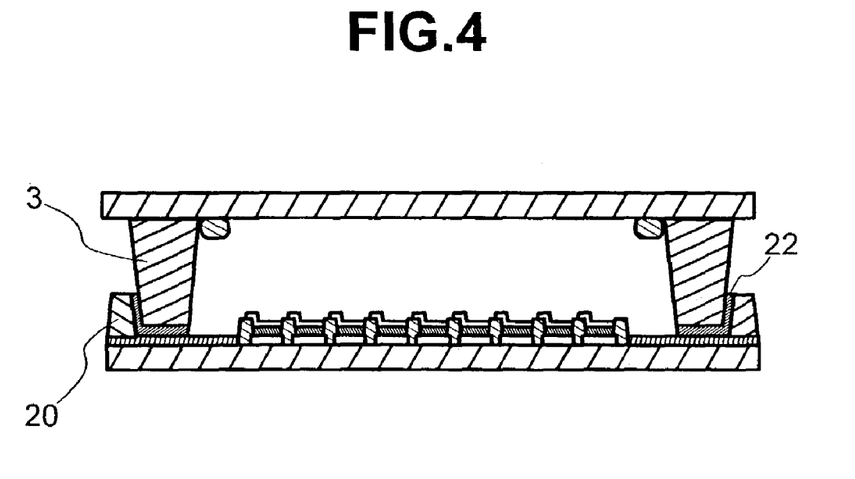
FIG. 4 is a cross sectional view showing the final configuration of an organic electro-luminescence device according to a second embodiment.

An organic electro-luminescence device was fabricated in the same manner as in the first embodiment, except that the positioning ribs 20 were arranged outside the cap outer-periphery surrounding rib 3. FIG. 4 is a view showing the configuration of an organic electro-luminescence device according to the second embodiment.

In this embodiment, the cap outer-periphery surrounding ribs 3, defining an area having a size of 322 mm×245 mm and having a width of 1800 μm, were formed, the positioning ribs 20, defining an area having a size of 324 mm×247 mm and having a width of 200 μm, were formed, and the positioning ribs 20 were arranged outside the cap outer-periphery surrounding ribs 3. At the time of overlapping and joining the emitter element forming substrate 1 and the cap 4 together, an inner peripheral side of the positioning ribs 20 comes into contact with an outer peripheral side of the cap outer-periphery surrounding rib 3, so as to serve as a guide, thus enabling overlapping with less positional deviation.

In addition, the positioning ribs 20 are formed to have a thickness of 800 μm greater than the sum of a thickness of 500 μm of the absorbent material and a thickness of about 5.1 μm of the emitter elements as formed. Also, the sealant 22 is applied on an inner periphery of the positioning ribs 20 by screen printing, the use of a dispenser or the like; and, since the sealant is crushed and spread inward when the emitter element forming substrate 1 and the cap 4 are overlapped, it is necessary to adjust the amount of sealant 22 being applied, so that no will sealant reach a region where the emitter elements are formed.

THIRD EMBODIMENT

An organic electro-luminescence device was fabricated in the same manner as in the first embodiment, except that the positioning ribs were doubly formed concentrically, the sealant was applied in a region surrounded by the ribs, and the cap outer-periphery bounded rib was arranged in that sealant region.

Figure 5:
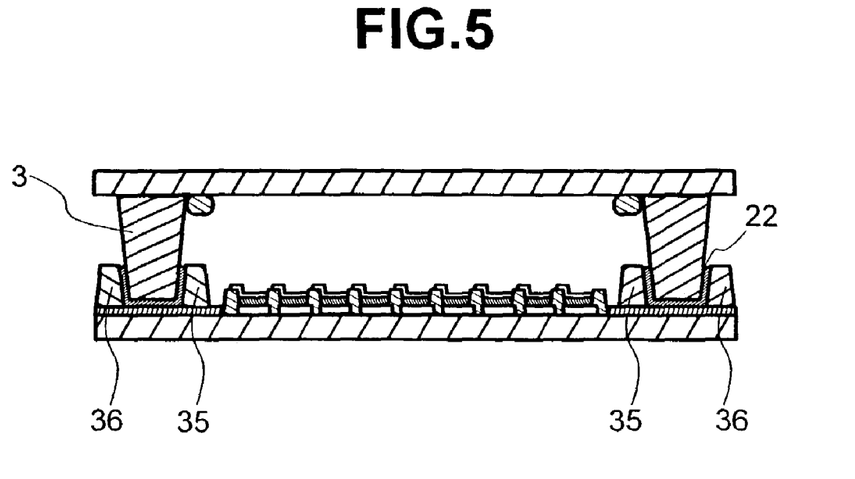
FIG. 5 is a cross sectional view showing the final configuration of an organic electro-luminescence device according to a third embodiment.

FIG. 5 is a view showing the configuration of an organic electro-luminescence device according to this third embodiment. In FIG. 5, the reference numeral 35 denotes first positioning ribs, and the reference numeral 36 denotes second positioning ribs.

In the embodiment, the cap outer-periphery surrounding ribs 3, defining an area having a size of 322 mm×245 mm and having a width of 1800 μm, were formed. The first positioning ribs 35, defining an area having a size of 320 mm×243 mm and having a width of 200 μm were formed, and the second positioning ribs 36, defining an area having a size of 324 mm×247 mm and having a width of 200 μm, were formed. The cap outer-periphery surrounding rib 3 was arranged in the region interposed between the first positioning ribs 35 and the second positioning ribs 36.

At the time of overlapping and joining the emitter element forming substrate 1 and the cap 4 together, an outer peripheral side of the first positioning ribs 35 and an inner peripheral side of the second positioning ribs 36 comes into contact with the sides of the cap outer-periphery surrounding ribs 3, so as to serve as a guide, thus enabling overlapping with less positional deviation.

In addition, since the sealant 22 is applied in a region interposed between the first positioning ribs 35 and the second positioning ribs 36, even a sealant having a low viscosity can be used without fear that it will flow to the outside.

FOURTH EMBODIMENT

FIGS. 6A to 6G show the process of manufacture of an organic electro-luminescence device according to a fourth embodiment.

Figure 6A:
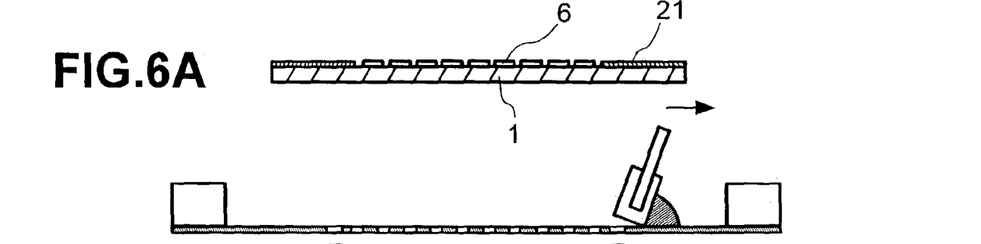
FIGS. 6A to 6G are diagrams illustrating steps in the manufacture of an organic electro-luminescence device according to a fourth embodiment.

In this embodiment, an ITO that is a transparent conductive material was first applied on the entire one side of the emitter element forming substrate 1, which is a light transmitting substrate, by means, as shown in FIG. 6A, and anode electrodes 6 and an external terminal 21 were formed through exposure and development. In addition, the surfaces of the anode electrodes 6 are preferably smooth. In addition, in this embodiment, the ITO being used had a sheet resistivity of about 10 $\Omega/cm^2$ or less, and the surfaces thereof were subjected to smoothening processing.

Figure 6B:
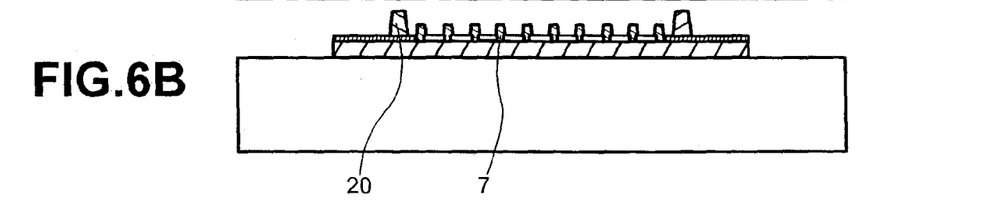

Subsequently, the emitter element forming substrate 1 was held on the substrate fixing table 19 so as to have the anode electrodes 6 and the external terminal 21 facing upward, as shown in FIG. 6B, and the pixel separation banks 7 and the positioning ribs 20, having a greater film thickness than that of the banks, were simultaneously formed by the method illustrated in FIGS. 2A and 2B. In the embodiment, since emission is taken out from a side of the emitter element forming substrate 1, a drive circuit formed on the emitter element forming substrate 1 causes interference, so that, in the case where pixels are formed in the same number and in the same area, the display area becomes smaller in size than that in the case where emission is taken out from the side on which the cap is located.

In this embodiment, one pixel had a display size of 180 μm in length and 80 μm in width, and a pitch of 300 μm in length and 100 µm in width. Since pixel separation banks must cover other areas than display areas, they are sized to have a widthwise line width of 120 µm and a lengthwise line width of 20 µm, the pitch of widthwise lines being 300 µm and the pitch of lengthwise lines being 100 µm.

Like the first embodiment, an area, in which pixel separation banks were formed, had a size of 308 mm×231 mm with a diagonal line of 15.2 inches, and the number of pixels provided therein were 1024×3 (three colors of red, green, blue), that is, a total of 3072 in width and 768 in length. In this embodiment, since the same hole-transport layers and the same emitting layers as those in the first embodiment were used, the pixel separation banks were likewise formed to have a film thickness of 5 µm. Also, in this embodiment, since the same screen form and the same plate pixel separation banks as those in the first embodiment were used, an emulsion for formation of a pattern in the screen form plate was 30 µm when performing application, with the line width being 20 µm and the film thickness being 5 µm.

In addition, there is a tendency in screen printing, when the line width is greater than a certain line width, for the coating thickness to become constant; and, when the line width decreases from the certain line width, the coating thickness decreases as described previously. With a combination of the materials for the pixel separation banks and the screen form plate, the tendency of the coating thickness relative to the width of the apertures in the screen form plate to be varied depends upon whether the width of the apertures in a screen form plate is above or below 150 µm. More specifically, when lengthwise lines having a width of 20 µm and widthwise lines having a width of 120 µm are formed in a screen form plate having apertures of the same width, the lengthwise lines having a width of 20 µm are coated to have a film thickness of around 5 µm, while the widthwise lines having a width of 120 µm are coated to have a film thickness of around 25 µm, which is close to the thickness of the emulsion for the screen form plate, thus producing a large difference in film thickness between the lengthwise lines and the widthwise lines in the same pixel separation banks.

Hereupon, in order to make the lengthwise lines and the widthwise lines in the pixel separation banks uniform, the widthwise lines having a width of 120 µm are divided into patterns, in which three widthwise lines having a width of 25 µm are arranged in a spacing of 22.5 µm, to be printed to a greater thickness than the lengthwise lines having a width of 20 µm; and, then, an ink was caused to flow into the space areas to be leveled, thus filling the spaces and making the widthwise lines equal in level to the lengthwise lines. The operation, except for the above-described features, was the same as described with reference to FIG. 3B, and so a repeated explanation thereof is omitted.

Figure 6C:
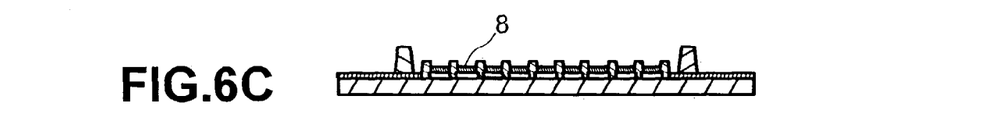

FIG. 6C, which shows the next processing, is the same as FIG. 3C, except that the pixel forming region is small, and so a repeated explanation thereof is also omitted.

Figure 6D:
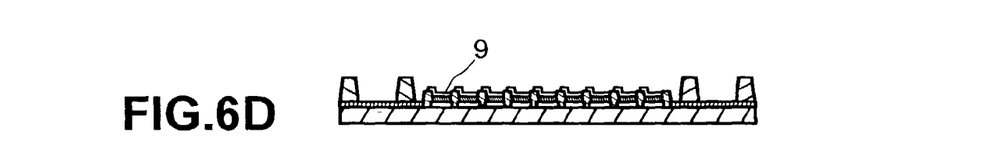

Subsequently, cathode electrodes were separated for every pixel and formed on a substrate, in which emitting layers of red, green and blue colors were formed on predetermined banks, as shown in FIG. 6D, by means of the vacuum evaporation method. In the embodiment, Al/Ca was used as the material for the cathode electrodes. However, the material for the cathode electrodes is not limited to Al/Ca, but other materials may be used provided that the work function thereof is small.

Figure 6E:
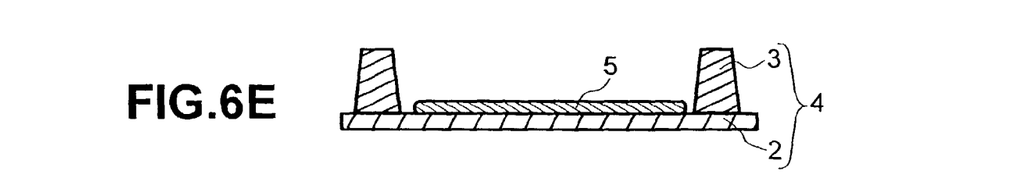

Subsequently, the cap outer-periphery surrounding ribs 3 were formed on an outer periphery of the cap substrate 2, which is composed of a light transmitting substrate, in a picture-frame manner, as shown in FIG. 6E, and the absorbent material 5 was mounted in a region surrounded by the cap outer-periphery surrounding rib 3. In this embodiment, since emission is taken out from the side of the emitter element forming substrate, the absorbent material 5 may be fixed in a region in which the emitter elements were formed, when the cap is overlapped on the emitter element forming substrate. Also, it is possible to use a cap formed by carving an interior surface of a glass plate or quartz plate by machining or sand blasting, as well s to use a cap formed by integral molding of a metallic plate or glass plate by use of a press or the like.

In addition, in the case of using a cap formed by machining the use of a, press or the like, the positioning ribs 20 must be dimensionally adjusted to projections on a periphery of the cap so that, when the cap and the emitter element forming substrate are to be overlapped and joined together, the positioning ribs alternately come into contact with the projections on the periphery of the cap. Also, the use of a dispenser and screen printing may be employed to further form the cap outer-periphery surrounding ribs on projections on a periphery of a cap that has been carved by machining or a cap formed by means of a press or the like, and positioning in overlapping may be made by use of the positioning ribs as a guide.

Figure 6F:
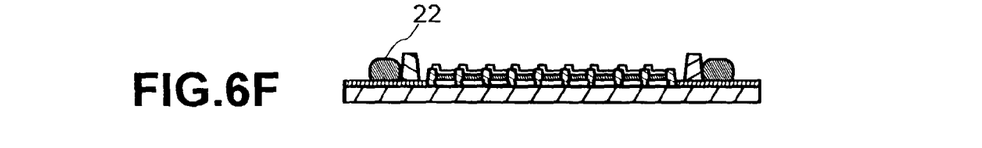

FIG. 6F, which shows the next processing is the same as FIG. 3F, and so a repeated explanation thereof is omitted.

Figure 6G:
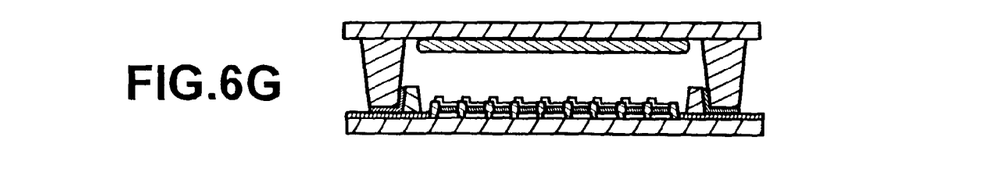

Subsequently, as shown in FIG. 6G, the self-alignment effect provided by the positioning ribs 20 and the cap outer-periphery surrounding ribs 3 causes the emitter element forming substrate 1 and the cap 4 to be in registry with each other merely by overlapping, and after effecting shielding sufficient to eliminate leakage of ultraviolet light to an emitter element forming region, ultraviolet light is irradiated from outside the cap substrate to cure the sealant. Subsequently, heating is effected at 80° C. in an oven to subject the sealant to secondary curing (main curing). In addition, the operation is wholly carried out in nitrogen, which is an inert gas.

Subsequently, a display can be fabricated by connecting a drive circuit to the external terminal 21. The display makes it possible to observe a picture image through the emitter element forming substrate. In addition, although the positioning ribs 20 are mounted inside the cap outer-periphery surrounding ribs 3 in the same manner as in the first embodiment, the positioning ribs may be configured in the same manner as in the second and third embodiments.

FIFTH EMBODIMENT

An organic electro-luminescence device was fabricated in the same manner as in the first, second, third and fourth embodiments, except for the use of an ink material having a lower light transmissivity than that used as a material for pixel separation banks.

In this embodiment, a material for pixel separation banks having a light transmissivity of 0.05% in the range of light wavelength of 300 to 800 nm, and thus having little light transmitting therethrough, was prepared by mixing black ultra-fine particles NanoTek Black-1 manufactured by CI Kasei Corporation, having a concentration of 3% in volume ratio, into polyimide PP-2000 for screen printing, manufactured by Central Glass Corporation, and this material was used for the pixel separation banks in the first, second, third and fourth embodiments. By using such material as the material for the pixel separation banks, the entry of light into the pixel separation banks can be prevented, and the phenomenon involving the mixing of emission from adjacent pixels and the leakage of light to the outside from the pixel separation banks can be prevented. In addition, the device is not limited to use of the above-described material for pixel separation banks and the black ultra-fine particles, and a material having a lower light transmissivity is preferable as the material for pixel separation banks.

SIXTH EMBODIMENT

An organic electro-luminescence device was fabricated using the method described in one of the first to fifth embodiments, except for the use of an emitter element forming substrate with thin-film transistors formed thereon in place of the emitter element forming substrate with the anode electrodes formed thereon.

Thin-film transistors are manufactured through the step of applying an organo-silicon nano-cluster on a substrate having an insulating surface; the step of oxidizing the organo-silicon nano-cluster to form an oxide silicon film; the step of forming an island non-single crystal silicon film having a source region, drain region, and a channel region interposed therebetween; the step of forming a gate insulating film on the island non-single crystal silicon film; and the step of forming gate electrodes in the channel region with the gate insulating film disposed therebetween, and commonly known methods can be used for the respective steps.

Here, the organo-silicon nano-cluster indicates an organic silicone compound, which is soluble in organic solvents and has a band gap of 3 eV to 1.2 eV, and which is obtained by reacting a silane tetrahalide and an organic halide in the existence of an alkali metal and an alkaline-earth metal and, further, processing the same with hydrofluoric acid. A part of the silane tetrahalide may be replaced by silane trihalide or silane dihalide.

The organo-silicon nano-cluster thus obtained is soluble in conventional organic solvents, such as hydrocarbon, alcohol, ether, aromatic solvents, polar solvents, and so on. Also, the processing with hydrofluoric acid is carried out at the last of the composition, whereby oxygen atoms taken into the silicone nano-cluster can be removed from oxygen, water, and a terminator contained in the reaction system. Such oxygen atoms are not preferable, since they are responsible for creation of silicone oxide films in the case where silicone thin-films are to be obtained. By performing the processing with hydrofluoric acid, a silicone nano-cluster as a precursor for silicone thin-films, containing no oxygen atom, can be obtained.

Thin films of organo-silicon nano-cluster can be obtained from a solution with an organo-silicon nano-cluster dissolved in a suitably selected solvent by means of a conventional thin-film forming method, such as a wet process, including a spin coating method, a dipping method and so on. When the organo-silicon nano-cluster as deposited is heated or subjected to irradiation of ultraviolet rays in an atmosphere free of oxygen, or a reducing atmosphere, silicone thin films can be obtained, and when they are heated or subjected to irradiation with ultraviolet rays in an oxidizing atmosphere, oxide silicon thin films can be obtained.

The above-described steps of heating and irradiation with ultraviolet rays may be combined with each other. Also, laser irradiation in an atmosphere substantially free of oxygen, or a reducing atmosphere, makes it possible to obtain silicon thin films.

TFT is formed on an oxide silicon thin film with such an organo-silicon nano-cluster as a precursor. As described above, the organo-silicon nano-cluster contains silane tetrahalide as a stock thereof, and the oxide silicon thin film with the organo-silicon nano-cluster as a precursor contains a halogen. Halogen produces the effect of segregating, catching and getting sodium ions, potassium ions, and the like to effectively prevent dispersion of impurities into the TFT from the glass substrate. Further, the thicker the film thickness of the oxide silicon film is, the more the effect of prevention of dispersion of impurities will be. The organo-silicon nano-cluster can be deposited by use of the spin coating method, so that it is easy to form a thick film having a large area, and it is capable of suppressing variation of a threshold caused by impurities and eliminating generation of warps and cracks. Therefore, the invention is very useful in the manufacture of an organic electro-luminescence device, in which a glass substrate having a large area is used.

Also, the step of oxidizing the organo-silicon nano-cluster and the step of making the organo-silicon nano-cluster into a silicon thin film without oxidizing the organo-silicon nano-cluster are suitably combined to make it possible to form an oxide silicon film in such a manner as to have the same surrounding island silicon layer and its neighborhood, thus realizing a structure in which any difference in level is decreased at the ends of an island semiconductor layer, and preventing a reduction in the withstand voltage, due to thin-filming of the gate insulating film. Besides, this technique can reduce the cost of manufacture because the island semiconductor layer and its neighborhood can be formed in a smaller number of steps than a conventional island semiconductor layer forming method including exposure, development and etching.

The thin-film transistors according to the invention comprise an oxide silicon film provided on a substrate having an insulating surface, a plurality of island non-single crystal semiconductor layers having main surfaces and end surfaces, the island non-single crystal semiconductor layers having a source region, drain region, and a channel region interposed therebetween, a first insulating film in contact with only the end surfaces of the island non-single crystal semiconductor layers, a second insulating film covering the island non-single crystal semiconductor layers and the first insulating film, and gate electrodes formed on the channel region with the second insulating film therebetween, and source electrodes and drain electrodes in contact with the source region and the drain region, the oxide silicon film containing a halogen.

Since the island non-single crystal semiconductor layers and the first insulating film contact each other only at the end surfaces, the difference in level is small therebetween so that it is possible to prevent reduction in the withstand voltage, due to thin-filming of the gate insulating film. Further, since the oxide silicon film contains a halogen, it is possible to effectively prevent entry and dispersion of impurities into the gate oxide film from a glass substrate.

First, an explanation will be given of a method of preparing an organo-silicon nano-cluster solution. Shaved Mg metal (64 mmol), which is an alkali metal, is put in a round bottom flask and heated in a vacuum at 120° C. so as to be activated; and, after cooling the metal, the reaction system is put in a nitrogen atmosphere and a dehydrated tetrahydrofuran (THF) is added. While applying ultrasonic waves (60 W) to the semi-product at 0° C., tetrachlorosilane (16 mmol) is added for reaction. After reaction for over 2.5 hours, a resulting dark brown reaction liquid is made to react with tert-butyl bromide (16 mmol).

After reaction for one hour, the reaction liquid is raised to 50° C., and then it is caused to make a reaction over a period of 0.5 hour. The reaction liquid is made to drip in distilled water, and the insoluble content is recovered by use of a filtering method. The recovered insoluble content is dispersed in a 47% hydrofluoric acid and caused to agitatingly react for 30 minutes, thus providing another insoluble content by means of filtration. Toluene as a solvent is used to prepare a 16 weight % solution of the insoluble content, thereby to make an organo-silicon nano-cluster solution.

Figure 7:
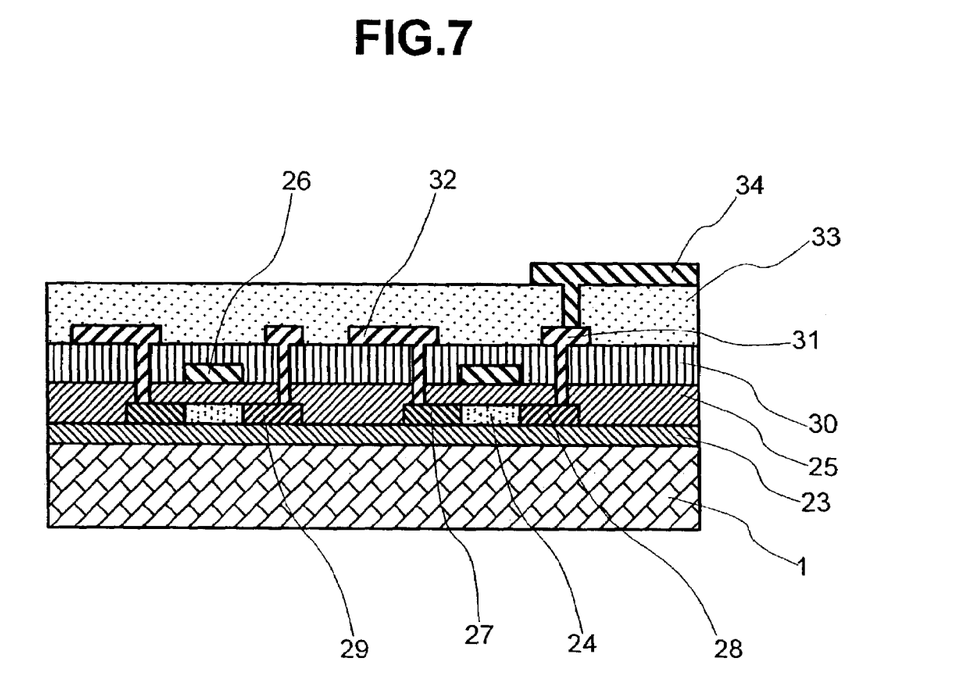
FIG. 7 is a cross sectional view showing thin-film transistors according to a sixth embodiment.

A method of forming thin-film transistors on a glass substrate will be described with reference to FIG. 7.

The spin coating method, with the speed of revolution adjusted, is used to apply the organo-silicon nano-cluster solution on an emitter element forming substrate 1 (348 mm×267 mm) composed of non-alkali glass having a strain point of 670° C. to provide for a film thickness of 500 nm, and the solution is dried on a hot plate at 80° C. for one minute. Thereafter, a 500W ultra-high mercury lamp is used in an oxygen atmosphere to irradiate ultraviolet rays for 3 minutes to provide an oxide silicon film (SiO2) 23. Further, the plasma CVD method is used to accumulate an amorphous silicon layer 50 nm thick. Subsequently, an XeCl excimer laser is irradiated to crystallize the amorphous silicon layer so as to provide a polysilicon film.

Subsequently, a known photo-etching processing is used to pattern the polysilicon film to provide an island polysilicon layer 24. Thereafter, the plasma CVD method is used to accumulate a SiO2 film, which will form a gate insulating film 25 that is 70 nm thick; and, further, the sputtering method is used to accumulate Nb to 250 nm thick. A known photo-etching processing is used to pattern Nb to form the gate electrodes 26.

Subsequently, a high-resistance N type polysilicon layer 27 is formed for N channel thin-film transistors using the gate electrodes 26 as a mask and with the use of ion implantation, and, then, a low-resistance N type polysilicon layer 28 is formed using resist as a mask. Meanwhile, a low-resistance P type polysilicon layer 29 is formed for P channel thin-film transistors using the gate electrodes 26 as a mask and with the use of ion implantation.

A desirable range of sheet resistance of the high-resistance polysilicon layer is 20 kΩ to 100 kΩ, and a desirable range of sheet resistance of the low-resistance polysilicon layer is 500 Ω to 1000 Ω. Further, an interlayer insulating film 30 composed of SiO2 is formed so as to cover the whole layers; and, source electrodes 31, drain electrodes 32 and wirings, which are composed of a three-layer metal film of Ti/Al/Ti, are formed through contact through holes formed in the interlayer insulating film 30. Here, the use of the three-layer metal film is intended to reduce the contact resistance between the low-resistance polysilicon layer and Al and the contact resistance between the pixel electrodes (ITO) 34 and Al.

After patterning of the source electrodes 31, the drain electrodes 32 and the wirings, a protective insulating film 33 composed of Si3N4 and having a film thickness of 500 nm is formed so as to cover the whole layers; and, further, the pixel electrodes (ITO) 34 and the source electrodes 31 of the N channel thin film transistor 28 in a picture image display are connected to each other through contact through holes formed in the protective insulating film 33.

Oxidation of the organo-silicon nano-cluster at the time of formation of the substrate layer may be made by a heating method or a combination of an ultraviolet ray irradiation method and a heating method. In this case, irradiation of ultraviolet rays has the effect of enhancing the throughput, and heating has the affect of improving the film quality, such as the minuteness of the film. Also, not only can an oxide silicon film be used, but also a laminate film of oxide silicon and thin silicon nitride may be used, as the substrate layer.

When silicon nitride is used as a buffer layer, it is possible to effectively prevent entry and dispersion of impurities into the gate oxide film from a glass substrate.

One method of crystallizing amorphous silicon may be a solid growth method making use of thermal annealing and a combination of thermal annealing and laser annealing. The gate insulating film may be an oxide film of an organo-silicon nano-cluster. The action of a halogen in the film suppresses movements of sodium, potassium, or the like. Also, the method of accumulating an insulating film, such as the interlayer film, protective film, or the like, may be a known accumulation method, such as the plasma CVD method or the like. Also, materials for the gate, source, and drain electrodes may be a known electrode material, such as Al, Ti, Ta or the like.

Also, while heating is carried out at 500° C. in a vacuum condition ($1\times10^{-5}$ Torr) for one hour prior to irradiation of a XeCl excimer laser, ultraviolet rays may be irradiated in an atmosphere substantially free of oxygen, or a reducing atmosphere, or both may be combined. Irradiation of ultraviolet rays has the affect of enhancing the throughput, and heating has the affect of improving the film quality, such as the minuteness of the film. Further, the processing may be omitted, and crystallization may be effected by laser irradiation in an atmosphere substantially free of oxygen, or a reducing atmosphere. In this case, the processing is simplified, and so the manufacturing cost can be reduced.

Also, one method of oxidizing the organo-silicon nano-cluster may be by heating in an oxidizing atmosphere. In this case, it is desirable to form an island semiconductor layer prior to oxidation. A dense film can be obtained by heat treatment after formation of an island semiconductor layer. A further method of covering portions, which will make an island semiconductor layer, with a mask, and simultaneously forming the island semiconductor layer and an insulating film therearound by heating in an oxidizing atmosphere, is effective in simplifying the manufacturing processing. Further, the film quality of the semiconductor layer is improved by removing the mask and irradiating with ultraviolet rays or a laser.

Since an oxide silicon film or a non-single crystal silicon film is formed after the organo-silicon nano-cluster is deposited by the spin coating method, the method of oxidizing is effective in a processing which makes use of a large-sized substrate. Also, since the oxide silicon film formed from the organo-silicon nano-cluster contains a halogen, it is possible to prevent degradation in the characteristics of the thin-film transistors due to impurities in the glass substrate.

Further, since a construction, in which a difference in level at the ends of an island semiconductor layer is reduced, can be realized, a reduction in the withstand voltage, due to thin-filming of the gate insulating film, can be prevented. This technique can reduce the manufacture because the island semiconductor layer and its neighborhood can be formed with a smaller number of steps, including exposure and heating, or only exposure, or the like, than a conventional island semiconductor layer forming method including exposure, development and etching. Also, since the island semiconductor layer and the insulating film therearound contain a halogen, it is possible to prevent degradation in the characteristics of thin-film transistors due to entry and dispersion of impurities into the gate insulating film from a glass substrate.

The manufacturing method, described above, according to the present invention, adopts a spin coating method in place of the conventional CVD method, and so it can reduce the electric power consumption at the time of deposition.

Therefore, it is possible to provide a highly reliable and inexpensive liquid crystal display. Of course, merely by changing the manufacturing method of non-single crystal silicon film from the conventional CVD method to the spin coating method of the invention, uniform deposition can be carried out on a large-sized substrate, and the manufacturing cost can be reduced owing to advantages, such as reduction in electric power at the time of deposition, or the like, to provide an inexpensive liquid crystal display.

In the above deposition, after the organo-silicon nano-cluster is deposited by means of the spin coating method, irradiation of ultraviolet rays may be effected in an atmosphere substantially free of oxygen, or a reducing atmosphere, and heating may be performed. Further, both may be combined. Irradiation of ultraviolet rays has the affect of enhancing the throughput, and heating has the affect of improving the film quality, such as the minuteness of the film. When laser irradiation is further performed after irradiation of ultraviolet rays or heating, the crystalline quality of silicone is improved, and the characteristics of the thin-film transistors are improved. Further, the processing of irradiation of ultraviolet rays or heating may be omitted, and laser irradiation may be performed in an atmosphere substantially free of oxygen, or a reducing atmosphere, to effect crystallization. In this case, the manufacturing cost can be reduced, since the processing is simplified.

The method of creating thin-film transistors is not limited to the described embodiment, but conventional methods used for liquid crystal panels will do.

According to the invention, a cap substrate having a light transmissivity is bonded to a substrate having emitter elements arranged thereon, and an absorbent is provided to afford an organic electro-luminescence device of high reliability; and, pixel separation banks and positioning ribs are created in the same step to enable simplification of the processing and assembling with high accuracy.

While we have shown and described several embodiments in accordance with our invention, it should be understood that the disclosed embodiments are susceptible of changes and modifications without departing from the scope of the invention. Therefore, we do not intend to be bound by the details shown and described herein, but intend to cover all such changes and modifications falling within the ambit of the appended claims.

We claim:

1. An organic electro-luminescence device comprising:
   an emitter element forming substrate, on which emitter elements each having an anode electrode, a cathode electrode, and at least an emitting layer formed in a pixel separation bank to be interposed between the anode electrode and the cathode electrode are formed;
   a cap substrate having a cap outer-periphery surrounding rib formed on an outer periphery of the cap substrate;
   a sealant,
   wherein the emitter element forming substrate has positioning ribs formed thereon to be arranged outside the emitter elements, the emitter element forming substrate and the cap substrate are joined together through the sealant being interposed between the emitter element forming substrate and the cap outer-periphery surrounding rib, the positioning ribs are joined to the cap outer-periphery surrounding rib through the sealant, and the emitter element are arranged inside a region surrounded by the cap outer-periphery surrounding rib.

2. The organic electro-luminescence device according to claim 1,
   wherein the emitter element forming substrate and the cap substrate comprise a light transmitting substrate having a substantially equivalent physical property.

3. The organic electroluminescence device according the claim 1,
   wherein the cap substrate is comprised of a material transmitting ultraviolet rays therethrough.

4. The organic electro-luminescence device according the claim 1,
   wherein an absorbent for absorption of at least gas or moisture is arranged in a space surrounded by the emitter element forming substrate, the cap substrate, and the cap outer-periphery surrounding rib.

5. The organic electro-luminescence device according the claim 4,
   wherein the absorbent is arranged in a region not to intercept emission from the emitter elements.

6. The organic electro-luminescence device according the claim 1,
   wherein the cathode electrode is formed of a light transmitting conductive material.

7. The organic electro-luminescence device according the claim 1,
   wherein the cathode electrodes are formed of a light transmitting conductive material, and
   light transmitted through the cathode electrodes from the emitter elements is observed through the cap substrate.

8. The organic electro-luminescence device according the claim 1,
   wherein the positioning ribs have a greater width than that of the pixel separation banks.

9. The organic electro-luminescence device according the claim 1,
   wherein the positioning ribs are formed from the same material as that of the pixel separation banks.

10. The organic electro-luminescence device according the claim 1,
    wherein the emitter element forming substrate comprises thin-film transistors for driving the emitter elements.

* * * * *